United States Patent
Zang et al.

(10) Patent No.: US 10,211,206 B1
(45) Date of Patent: Feb. 19, 2019

(54) TWO-PORT VERTICAL SRAM CIRCUIT STRUCTURE AND METHOD FOR PRODUCING THE SAME

(71) Applicant: GLOBALFOUNDRIES Inc., Grand Cayman (KY)

(72) Inventors: Hui Zang, Guilderland, NY (US); Jerome Ciavatti, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/800,905

(22) Filed: Nov. 1, 2017

(51) Int. Cl.
| H01L 27/11 | (2006.01) |
|---|---|
| G11C 11/412 | (2006.01) |
| G11C 11/419 | (2006.01) |
| H01L 27/092 | (2006.01) |
| H01L 29/423 | (2006.01) |
| H01L 21/8238 | (2006.01) |

(52) U.S. Cl.
CPC .......... *H01L 27/092* (2013.01); *G11C 11/412* (2013.01); *G11C 11/419* (2013.01); *H01L 21/823885* (2013.01); *H01L 27/1104* (2013.01); *H01L 29/42356* (2013.01)

(58) Field of Classification Search
None
See application file for complete search history.

(56) References Cited

U.S. PATENT DOCUMENTS

| 5,422,296 A * | 6/1995 | Lage | H01L 27/11 257/E21.661 |
|---|---|---|---|
| 6,417,032 B1 * | 7/2002 | Liaw | H01L 27/1104 257/903 |
| 6,445,041 B1 * | 9/2002 | Ishida | H01L 27/11 257/369 |

(Continued)

OTHER PUBLICATIONS

A. Velso et al., "Junctionless gate-all-around lateral and vertical nanowire FETs with simplified processing for advanced logic and analog/RF applications and scaled SRAM cells", published in VLSI Technology, 2016 IEEE Symposium on VLST Technology Digest of Technical Papers, retrieved on Nov. 1, 2017 from "http://ieeexplore.ieee.org/document/7573409/", 2 pages.

(Continued)

*Primary Examiner* — David E Graybill
(74) *Attorney, Agent, or Firm* — Ditthavong & Steiner, P. C.

(57) ABSTRACT

Methods of connecting a read driver transistor to a PD and PU inverter of a two-port vertical SRAM via a shared GAA or a vertical cross-couple contact between a GAA of the read driver transistor and the bottom source/drain region of the PD and PU inverter and the resulting devices are provided. Embodiments include forming a first PD transistor, a first PU transistor, a second PU transistor, and a second PD transistor over a substrate; forming a first PG transistor and a second PG transistor over the substrate; forming a read transistor and a read driver transistor laterally separated in the first direction over the substrate, the read transistor and the read driver transistor adjacent to the second PG transistor and the (Continued)

first PD transistor, respectively; and connecting the read driver transistor, the first PD transistor, and the first PU transistor.

18 Claims, 4 Drawing Sheets

(56) References Cited

U.S. PATENT DOCUMENTS

| | | | | |
|---|---|---|---|---|
| 6,569,723 B2* | 5/2003 | Liaw | H01L 27/1104 | 257/E21.661 |
| 6,597,041 B2* | 7/2003 | Ohbayashi | H01L 27/11 | 257/369 |
| 6,922,354 B2* | 7/2005 | Ishikura | H01L 27/11 | 257/369 |
| 7,176,125 B2* | 2/2007 | Liaw | H01L 27/11 | 257/368 |
| 7,233,032 B2* | 6/2007 | Liaw | H01L 23/50 | 257/202 |
| 7,289,056 B2* | 10/2007 | Liu | G01S 7/021 | 342/465 |
| 7,365,432 B2* | 4/2008 | Liaw | G11C 8/16 | 257/206 |
| 7,723,806 B2* | 5/2010 | Liaw | H01L 27/1104 | 257/207 |
| 8,144,540 B2* | 3/2012 | Liaw | G11C 8/16 | 365/154 |
| 8,174,868 B2* | 5/2012 | Liaw | G11C 8/16 | 365/154 |
| 8,203,868 B2* | 6/2012 | Yamaoka | G11C 11/412 | 365/154 |
| 8,315,084 B2* | 11/2012 | Liaw | G11C 11/413 | 365/154 |
| 8,390,033 B2* | 3/2013 | Liaw | G11C 11/412 | 257/206 |
| 8,405,216 B2* | 3/2013 | Liaw | H01L 23/5226 | 257/758 |
| 8,625,334 B2* | 1/2014 | Liaw | H01L 27/1104 | 365/154 |
| 8,847,361 B2* | 9/2014 | Liaw | G11C 11/412 | 257/225 |
| 8,879,305 B2* | 11/2014 | Liaw | H01L 27/1104 | 365/154 |
| 8,942,030 B2* | 1/2015 | Liaw | H01L 27/11 | 365/154 |
| 8,987,831 B2* | 3/2015 | Liaw | G11C 11/412 | 257/368 |
| 9,012,287 B2* | 4/2015 | Liaw | H01L 27/1104 | 438/283 |
| 9,099,199 B2* | 8/2015 | Lin | G11C 11/41 | |
| 9,183,933 B2* | 11/2015 | Liaw | G11C 15/04 | |
| 9,236,300 B2* | 1/2016 | Liaw | H01L 21/76895 | |
| 9,336,859 B2* | 5/2016 | Lin | G11C 11/41 | |
| 9,362,290 B2* | 6/2016 | Liaw | G11C 11/412 | |
| 9,362,292 B1* | 6/2016 | Liaw | H01L 27/1104 | |
| 9,406,681 B2* | 8/2016 | Liaw | G11C 15/04 | |
| 9,425,201 B2* | 8/2016 | Liaw | H01L 27/1104 | |
| 9,515,077 B1* | 12/2016 | Liaw | H01L 27/1104 | |
| 9,558,809 B1* | 1/2017 | Liaw | G11C 11/417 | |
| 9,607,685 B2* | 3/2017 | Liaw | G11C 11/419 | |
| 9,620,510 B2* | 4/2017 | Liaw | H01L 27/0207 | |
| 9,646,973 B2* | 5/2017 | Liaw | H01L 27/1104 | |
| 9,646,974 B1* | 5/2017 | Liaw | H01L 27/1104 | |
| 9,691,774 B2* | 6/2017 | Liaw | H01L 27/11 | |
| 9,734,897 B1* | 8/2017 | Zang | G11C 11/419 | |
| 9,773,791 B2* | 9/2017 | Liaw | H01L 27/1104 | |
| 9,799,661 B1* | 10/2017 | Zang | H01L 27/1104 | |
| 9,824,748 B1* | 11/2017 | Zang | G11C 11/412 | |
| 9,831,253 B2* | 11/2017 | Liaw | H01L 27/1116 | |
| 9,847,120 B2* | 12/2017 | Liaw | G11C 5/02 | |
| 9,858,985 B2* | 1/2018 | Liaw | G11C 11/412 | |
| 9,911,744 B2* | 3/2018 | Liaw | H01L 27/1104 | |
| 9,941,173 B2* | 4/2018 | Liaw | H01L 21/82380 | |
| 2001/0043487 A1* | 11/2001 | Nii | G11C 7/18 | 365/154 |
| 2002/0127786 A1* | 9/2002 | Liaw | H01L 27/1104 | 438/153 |
| 2004/0113207 A1* | 6/2004 | Hsu | G11C 11/412 | 257/368 |
| 2005/0124095 A1* | 6/2005 | Liaw | H01L 23/50 | 438/128 |
| 2005/0219094 A1* | 10/2005 | Murphy | H03K 17/785 | 341/133 |
| 2006/0019488 A1* | 1/2006 | Liaw | H01L 27/11 | 438/637 |
| 2006/0038234 A1* | 2/2006 | Liaw | G11C 8/16 | 257/368 |
| 2007/0235765 A1* | 10/2007 | Liaw | H01L 27/11 | 257/207 |
| 2007/0262399 A1* | 11/2007 | Dewey | H01L 21/28194 | 257/410 |
| 2007/0279966 A1* | 12/2007 | Houston | G11C 11/412 | 365/154 |
| 2008/0031029 A1* | 2/2008 | Liaw | G11C 7/18 | 365/63 |
| 2008/0175068 A1* | 7/2008 | Houston | G11C 5/143 | 365/185.27 |
| 2010/0259971 A1* | 10/2010 | Liaw | G11C 8/16 | 365/154 |
| 2011/0075470 A1* | 3/2011 | Liaw | G11C 8/16 | 365/154 |
| 2011/0195564 A1* | 8/2011 | Liaw | G11C 11/412 | 438/585 |
| 2011/0222332 A1* | 9/2011 | Liaw | G11C 11/412 | 365/156 |
| 2011/0317485 A1* | 12/2011 | Liaw | H01L 27/11 | 365/182 |
| 2013/0058155 A1* | 3/2013 | Callen | H01L 27/0207 | 365/154 |
| 2013/0154027 A1* | 6/2013 | Liaw | G11C 11/412 | 257/390 |
| 2013/0181297 A1* | 7/2013 | Liaw | G11C 11/412 | 257/390 |
| 2013/0242644 A1* | 9/2013 | Lin | G11C 11/412 | 365/154 |
| 2013/0280903 A1* | 10/2013 | Liaw | G11C 11/412 | 438/595 |
| 2014/0131813 A1* | 5/2014 | Liaw | H01L 27/1104 | 257/401 |
| 2014/0133218 A1* | 5/2014 | Liaw | G11C 11/412 | 365/154 |
| 2015/0132903 A1* | 5/2015 | Liaw | H01L 27/11 | 438/212 |
| 2015/0200010 A1* | 7/2015 | Liaw | G11C 15/04 | 257/390 |
| 2015/0206890 A1* | 7/2015 | Liaw | H01L 27/1104 | 257/391 |
| 2015/0310908 A1* | 10/2015 | Lin | G11C 11/412 | 365/156 |
| 2016/0013190 A1* | 1/2016 | Liaw | G11C 15/04 | 257/390 |
| 2016/0078922 A1* | 3/2016 | Liaw | H01L 29/66666 | 365/51 |
| 2016/0104524 A1* | 4/2016 | Liaw | G11C 11/412 | 365/51 |
| 2016/0240541 A1* | 8/2016 | Liaw | G11C 11/412 | |
| 2016/0284600 A1* | 9/2016 | Liaw | G11C 11/412 | |
| 2016/0284712 A1* | 9/2016 | Liaw | H01L 27/1104 | |
| 2017/0032835 A1* | 2/2017 | Liaw | G11C 11/419 | |
| 2017/0077106 A1* | 3/2017 | Liaw | G11C 11/412 | |
| 2017/0110182 A1* | 4/2017 | Liaw | G11C 8/16 | |
| 2017/0179134 A1* | 6/2017 | Liaw | H01L 27/1104 | |
| 2017/0200491 A1* | 7/2017 | Liaw | G11C 11/419 | |
| 2018/0151553 A1* | 5/2018 | Liaw | H01L 27/0207 | |

OTHER PUBLICATIONS

Trong et al., "Design technology co-optimization for enabling 5nm gate-all-around nanowire 6T SRAM", published in IC Design &

(56) References Cited

OTHER PUBLICATIONS

Technology (ICICDT), 2015 International Conference, retrieved on Nov. 1, 2017 from "http://ieeexplore.ieee.org/document/7165874/", 4 pages.

* cited by examiner

US 10,211,206 B1

TWO-PORT VERTICAL SRAM CIRCUIT STRUCTURE AND METHOD FOR PRODUCING THE SAME

TECHNICAL FIELD

The present disclosure relates to the manufacture of static random-access memory (SRAM) semiconductor devices. The present disclosure is particularly applicable to a vertical gate-all-around (GAA) nanowire field-effect transistor (VFET) SRAM in the 5 nanometer (nm) technology node and beyond.

BACKGROUND

Cell scaling is of critical importance to continued improvement of complementary metal-oxide-semiconductor (CMOS) technology. A VFET is a promising device to enable device scaling beyond the 5 nm technology node. As a result, new constructs are required to allow continued scaling—moving to a vertical architecture in particular allows the use of new interconnect constructs that should allow continued scaling. Unlike a traditional six transistor (6T), an eight transistor (8T) dual port SRAM circuit has two more transistors, which decouple the READ function such that the READ and WRITE memory functions can be performed simultaneously.

Traditionally, to perform a SRAM READ function, a high voltage is applied to a SRAM word line (WL) and a bitline/bitline-bar (BL/BLB) is pre-charged to a high voltage; the success of which may be determined by sensing the voltage difference between the BL and the BLB. SRAM cell stability requires a cell to retain original data after the READ function, which has a strong correlation to a beta ratio (on current (Ion) of a pull-down (PD) transistor divided by the Ion of a pass gate (PG) transistor (Ion_PD/Ion_PG)). In contrast, to perform a SRAM WRITE function, a high voltage is applied to a WL and a BL/BLB is pre-charged to a data value; the success of which equals the ability to flip a bitcell internal node according to the WRITE data. Consequently, writability equals a strong correlation to a gamma ratio (Ion_PG divided by the Ion of a pull-up (PU) gate (Ion_PG/Ion_PU)). As a result, cell stability (beta ratio) and cell writability (gamma ratio) generate conflicting requirements on PG Ion.

A need therefore exists for methodology enabling a balance between conflicting requirements on PG Ion for cell stability and cell writability to achieve an improved soft yield (Ysoft) relative to a traditional SRAM and the resulting device.

SUMMARY

An aspect of the present disclosure is a method of connecting a read driver transistor to a PD and PU inverter of a two-port vertical SRAM via a shared GAA;

Another aspect of the present disclosure is a method of connecting a read driver transistor to a PD and PU inverter of a two-port vertical SRAM via a vertical cross-couple contact between a GAA of the read driver transistor and the bottom source/drain region of the PD and PU inverter;

A further aspect of the present disclosure is a two-port vertical SRAM circuit structure with the read driver transistor connected to a PD and PU inverter via a shared GAA or a vertical cross-couple contact.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first PD transistor, a first PU transistor, a second PU transistor, and a second PD transistor over a substrate, the first PD transistor and the first PU transistor laterally separated from the second PU transistor and the second PD transistor in a first direction and offset from the second PU transistor and the second PD transistor in a second direction perpendicular to the first direction; forming a first PG transistor and a second PG transistor over the substrate laterally separated in the first direction and offset from each other in the second direction, the first PG transistor adjacent to the second PD transistor in the first direction and the second PG transistor adjacent to the first PD transistor in the first direction; forming a read transistor and a read driver transistor laterally separated in the first direction over the substrate, the read transistor and the read driver transistor adjacent to the second PG transistor and the first PD transistor in the second direction, respectively; and connecting the read driver transistor, the first PD transistor, and the first PU transistor.

Aspects of the present disclosure include forming the first PG transistor, the second PU transistor, and the second PD transistor, by: forming a first n-type active region (nRX) and a first p-type active region (pRX) over the substrate laterally separated in the second direction; forming a metal layer between the first nRX and the first pRX, the metal layer electrically connecting the first nRX and the first pRX; forming a pair of vertical nanowires or a vertical fin over the first nRX or the first pRX for each of the first PG transistor, the second PU transistor, and the second PD transistor; forming a GAA over the first nRX and around the pair of vertical nanowires or the vertical fin of the first PG transistor; and forming a shared GAA over the first nRX and the first pRX and around the pair of vertical nanowires or the vertical fin for each of the second PD transistor and the second PU transistor, wherein the first PG transistor and the second PD transistor share the first nRX and the second PU transistor includes the first pRX. Other aspects include forming the read transistor and the second PG transistor by: forming a second nRX and a third nRX over the substrate laterally separated in the second direction, the second nRX being on an opposite side of the third nRX from the first pRX; forming a pair of vertical nanowires or a vertical fin for each of the read transistor and the second PG transistor; forming a GAA over the second nRX and around the pair of vertical nanowires or the vertical fin for the read transistor; and forming a GAA over the third nRX and around the pair of vertical nanowires or the vertical fin for the second PG transistor.

Further aspects include forming the read driver transistor, the first PD transistor, and the first PU transistor by: forming a second pRX over the substrate laterally separated from the third nRX and the first pRX in the second direction, between the third nRX and the first pRX, and offset from the first pRX in the first direction; forming a metal layer between the third nRX and the second pRX, the metal layer electrically connecting the third nRX and the second pRX; forming a pair of vertical nanowires or a vertical fin of each of the read driver transistor, the first PD transistor, and the first PU transistor; and forming a shared GAA over the second nRX, the third nRX, and the second pRX and around the pair of vertical nanowires or the vertical fin of each of the read driver transistor, the first PD transistor, and the first PU transistor, or a GAA over the second nRX and around the two vertical nanowires or the vertical fin for the read driver transistor and a shared GAA over the third nRX and the second pRX and around the two vertical nanowires or the vertical fin of each of the first PD transistor and the first PU transistor, respectively, wherein the first PD transistor and the second PG transistor share the third nRX and the first PU transistor includes the second pRX. Another aspect includes wherein the GAA for read driver transistor is formed, the read driver transistor, the first PD transistor, and the first PU transistor being connected by: forming a vertical cross-couple contact between the GAA and the third nRX. Additional aspects include cross-coupling the first PD transistor and the first PU transistor with the second PU transistor and the second PD transistor by: forming a first vertical cross-couple contact between the shared GAA of the second PU transistor and the second PD transistor and the second pRX; and forming a second vertical cross couple contact between either the shared GAA of the read transistor, the first PD transistor, and the first PU transistor or the shared GAA of the first PD transistor and the first PU transistor and the first pRX.

Other aspects include forming a first gate contact (CB), a second CB, and a third CB over a portion of each GAA of the read transistor, the second PG transistor, and the first PG transistor; forming a first source/drain contact (CA), a second CA, a third CA, a fourth CA, a fifth CA, and a sixth CA over the two vertical nanowires or the vertical fin of each of the read transistor, the first PU transistor, the second PD transistor, the second PU transistor, the first PG transistor, and the second PG transistor, respectively; and forming a shared CA over the pair of vertical nanowires or the vertical fin of each of the read driver transistor and the first PD transistor when the shared GAA of the read driver transistor, the first PD transistor, and the first PU transistor is formed or a seventh CA and an eighth CA over the pair of vertical nanowires or the vertical fin of each of the read driver transistor and the first PD transistor, respectively. Further aspects include wherein the first CB, the second CB, and the third CB are connected to a read word line (RWL), a write word line (WWL), and a WL, respectively, the first CA, the second CA, the third CA, the fourth CA, the fifth CA, and the sixth CA are connected to a read bitline (RBL), a BLB, a voltage drain (Vdd), the Vdd, a voltage supply (Vcc), the Vcc, and a BL, respectively, and the shared CA or the seventh CA and the eighth CA are connected to the Vcc.

Another aspect of the present disclosure is a device including: a first PD transistor, a PU transistor, a second PU transistor, and a second PD transistor over a substrate, the first PD transistor and the first PU transistor laterally separated from the second PU transistor and the second PD transistor in a first direction and offset from the second PU transistor and the second PD transistor in a second direction perpendicular to the first direction; a first PG transistor and a second PG transistor over the substrate laterally separated in the first direction and offset from each other in the second direction, the first PG transistor adjacent to the second PD transistor in the first direction and the second PG transistor adjacent to the first PD transistor in the first direction; and a read transistor and a read driver transistor laterally separated in the first direction over the substrate, the read transistor and the read driver transistor adjacent to the second PG transistor and the first PD transistor, respectively, in the second direction, wherein the first PD transistor and the first PU transistor are cross-coupled with the second PU transistor and the second PD transistor and the read driver transistor, the first PD transistor, and the first PU transistor are connected.

Aspects of the device include wherein the first PG transistor, the second PU transistor, and the second PD transistor include: a first nRX and a first pRX over the substrate laterally separated in the second direction; a metal layer between the first nRX and the first pRX electrically connecting the first nRX and the first pRX; a pair of vertical nanowires or a vertical fin over the first nRX or the first pRX for each of the first PG transistor, the second PU transistor, and the second PD transistor; a GAA over the first nRX and around the pair of vertical nanowires or the vertical fin for the first PG transistor; and a shared GAA over the first nRX and the first pRX and around the pair of vertical nanowires or the vertical fin of each of the second PD transistor and the second PU transistor, wherein the first PG transistor and the second PD transistor share the first nRX and the second PU transistor includes the first pRX. Other aspects include wherein the read transistor and the second PG transistor include: a second nRX and a third nRX over the substrate laterally separated in the second direction, the second nRX being on an opposite side of the third nRX from the first pRX; a pair of vertical nanowires or a vertical fin for each of the read transistor and the second PG transistor; a GAA over the second nRX and around the pair of vertical nanowires or the vertical fin of the read transistor; and a GAA over the third nRX and around the pair of vertical nanowires or the vertical fin for the second PG transistor, wherein the read transistor and the read driver transistor share the second nRX. Further aspects include wherein the read driver transistor, the first PD transistor, and the first PU transistor include: a second pRX over the substrate laterally separated from the third nRX and the first pRX in the second direction, between the third nRX and the first pRX, and offset from the first pRX in the first direction; a metal layer between the third nRX and the second pRX electrically connecting the third nRX and the second nRX; a pair of vertical nanowires or a vertical fin for each of the read driver transistor, the first PD transistor, and the first PU transistor; and a shared GAA over the second nRX, the third nRX, and the second pRX and around the pair of vertical nanowires or the vertical fin for each of the read driver transistor, the first PD transistor, and the first PU transistor, or a GAA over the second nRX and around the pair of vertical nanowires or the vertical fin of the read driver transistor and a shared GAA over the third nRX and the second pRX and around the pair of vertical nanowires or the vertical fin of each of the first PD transistor and the first PU transistor, respectively, wherein the first PD transistor and the second PG transistor share the third nRX and the first PU transistor includes the second pRX.

Additional aspects include wherein the GAA for read driver transistor is formed, the device further including: a vertical cross-couple contact between the GAA and the third nRX. Another aspect includes a first vertical cross-couple contact between the shared GAA of the second PU transistor and the second PD transistor and the second pRX; and a second vertical cross-couple contact between either the shared GAA of the read transistor, the first PD transistor, and the first PU transistor or the shared GAA of the first PD transistor and the first PU transistor and the first pRX. Other aspects include a first CA, a second CA, a third CA, a fourth CA, a fifth CA, a sixth CA over the pair of vertical nanowires or the vertical fin of each of the read transistor, the first PU transistor, the second PD transistor, the second PU transistor, the first PG transistor, and the second PG transistor, respectively; a shared CA over the pair of vertical nanowires or the vertical fin of each of the read driver transistor and the first PD transistor when the shared GAA of the read driver transistor, the first PD transistor, and the first PU transistor is formed, or a seventh CA and an eighth CA over the pair of vertical nanowires or the vertical fin of each of the read driver transistor and the first PD transistor, respectively; and a first CB, a second CB, a third CB over a portion of each GAA of the read transistor, the second PG transistor, and the first PG transistor, respectively. Further aspects include wherein the first CB, the second CB, and the third CB are connected to a RWL, a WWL, and a WL, respectively, the first CA, the second CA, the third CA, the fourth CA, the fifth CA, and the sixth CA are connected to a RBL, a BLB, a Vdd, the Vdd, a Vcc, the Vcc, and a BL, respectively, and the shared CA or the seventh CA and the eighth CA are connected to the Vcc.

Another aspect of the present disclosure is a device including: a first nRX, a second nRX, and a third nRX laterally separated in a first direction over a substrate; a first pRX and a second pRX over the substrate laterally separated in the first direction and offset in a second direction perpendicular to the first direction, the first pRX electrically connected to the second nRX and the second pRX electrically connected to the third nRX; two pairs of vertical nanowires or a pair of vertical fins laterally separated in the second direction over each of the first nRX, the second nRX, and the third nRX; a pair of vertical nanowires or a vertical fin over each of the first pRX and the second pRX; a first GAA and a first shared GAA laterally separated in the second direction over the first nRX each around a pair of vertical nanowires or a vertical fin, the first shared GAA also over the second nRX and the first pRX and around a pair of vertical nanowires or a vertical fin and the pair of vertical nanowires or the vertical fin, respectively; a second shared GAA over the third nRX and the second pRX and around a pair of vertical nanowires or a vertical fin and the pair of vertical nanowires or the vertical fin, respectively; a second GAA and a third GAA over the second nRX and the third nRX, respectively, and each around a pair of vertical nanowires or a vertical fin; a first vertical cross-couple contact between the second shared GAA and the first pRX and a second vertical cross-couple contact between the first shared GAA and the second pRX; a first CA over a pair of vertical nanowires or a vertical fin of the first nRX, a second CA over a pair of vertical nanowires or a vertical fin of the second nRX, a third CA and a fourth CA over the pair of vertical nanowires or the vertical fin of each of the first pRX and the second pRX, a fifth CA and a sixth CA each over a pair of vertical nanowires or a vertical fin of the third nRX; a shared CA over a pair of vertical nanowires or a vertical fin of the first nRX and over a pair of vertical nanowires or a vertical fin of the second nRX; and a first CB, a second CB, and a third CB over the first GAA, the second GAA, and the third GAA, respectively.

Aspects of the device include wherein first nRX forms a read transistor and a read driver transistor, the second nRX forms a first PG transistor and a first PD transistor, the first pRX forms a first PU transistor, the second pRX forms a second PU transistor, and the third nRX forms a second PD transistor and a second PG transistor. Other aspects include wherein the first CB, the second CB, and the third CB are connected to a RWL, a WWL, and a WL, respectively, the first CA, the second CA, the third CA, the fourth CA, the fifth CA, and the sixth CA are connected to a RBL, a BLB, a Vdd, the Vdd, a Vcc, the Vcc, and a BL, respectively, and the shared CA or the seventh CA and the eighth CA are connected to the Vcc. Further aspects include wherein the first shared GAA connects the read driver transistor and the first PD transistor and the first PU transistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
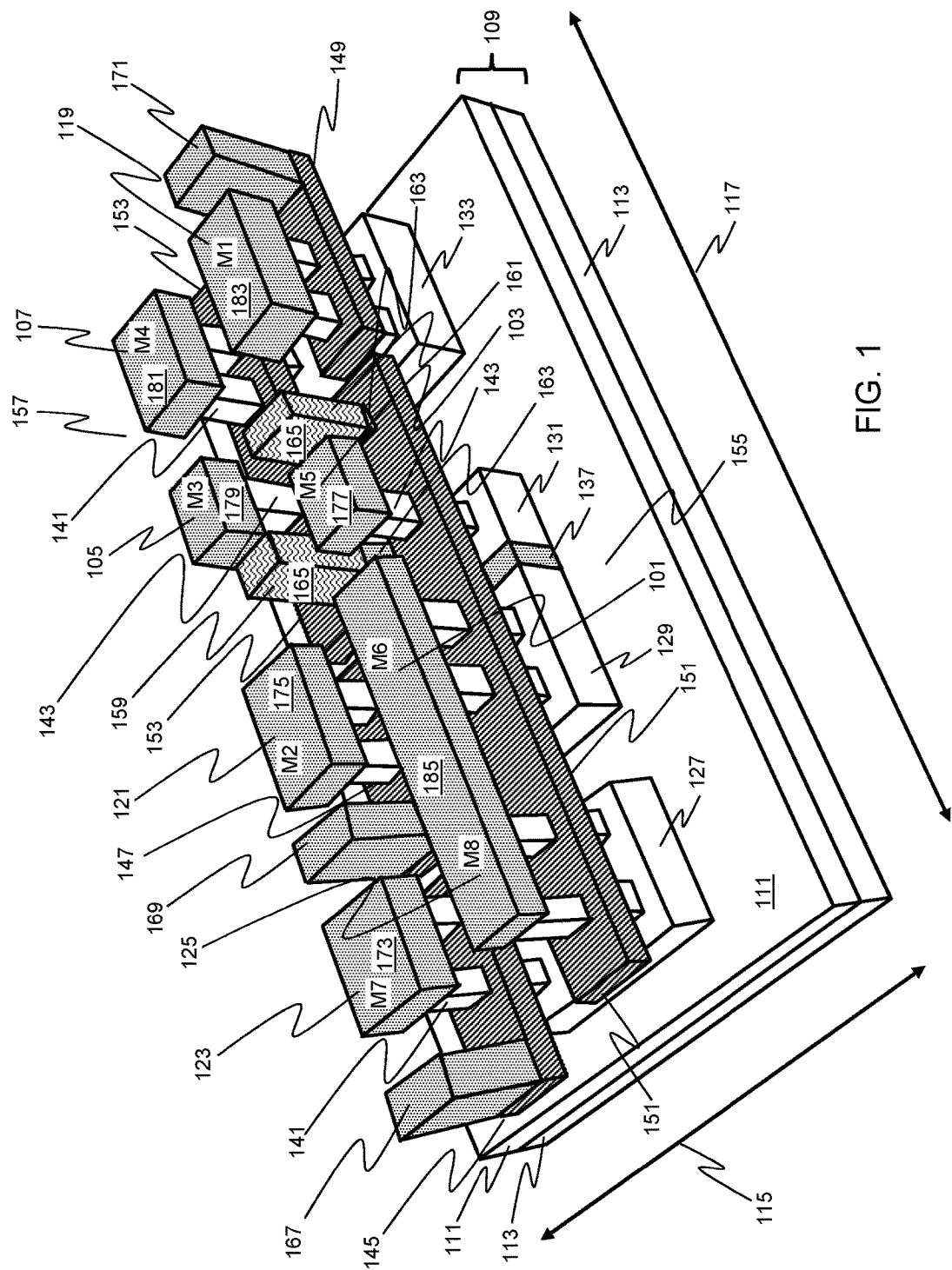
FIG. 1 schematically illustrates an axonometric view of a two-port vertical SRAM with the read driver transistor connected to a PD and PU inverter via a shared GAA, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of conflicting requirements on PG Ion for cell stability and writeability attendant upon forming a conventional SRAM device. The problem is solved, inter alia, by adding a read transistor and a read driver transistor to a conventional SRAM device and connecting the read driver transistor to a PD and PU inverter via a shared GAA or a vertical cross-couple contact between the GAA of the read driver transistor and the bottom source/drain region of the PD and PU inverter.

Methodology in accordance with embodiments of the present disclosure includes forming a first PD transistor, a first PU transistor, a second PU transistor, and a second PD transistor over a substrate, the first PD transistor and the first PU transistor laterally separated from the second PU transistor and the second PD transistor in a first direction and offset from the second PU transistor and the second PD transistor in a second direction perpendicular to the first direction. A first PG transistor and a second PG transistor are formed over the substrate laterally separated in the first direction and offset from each other in the second direction, the first PG transistor is adjacent to the second PD transistor in the first direction and the second PG transistor is adjacent to the first PD transistor in the first direction. A read transistor and a read driver transistor are formed laterally separated in the first direction over the substrate, the read transistor and the read driver transistor are adjacent to the second PG transistor and the first PD transistor in the second direction, respectively; and the read driver transistor, the first PD transistor, and the first PU transistor are connected.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
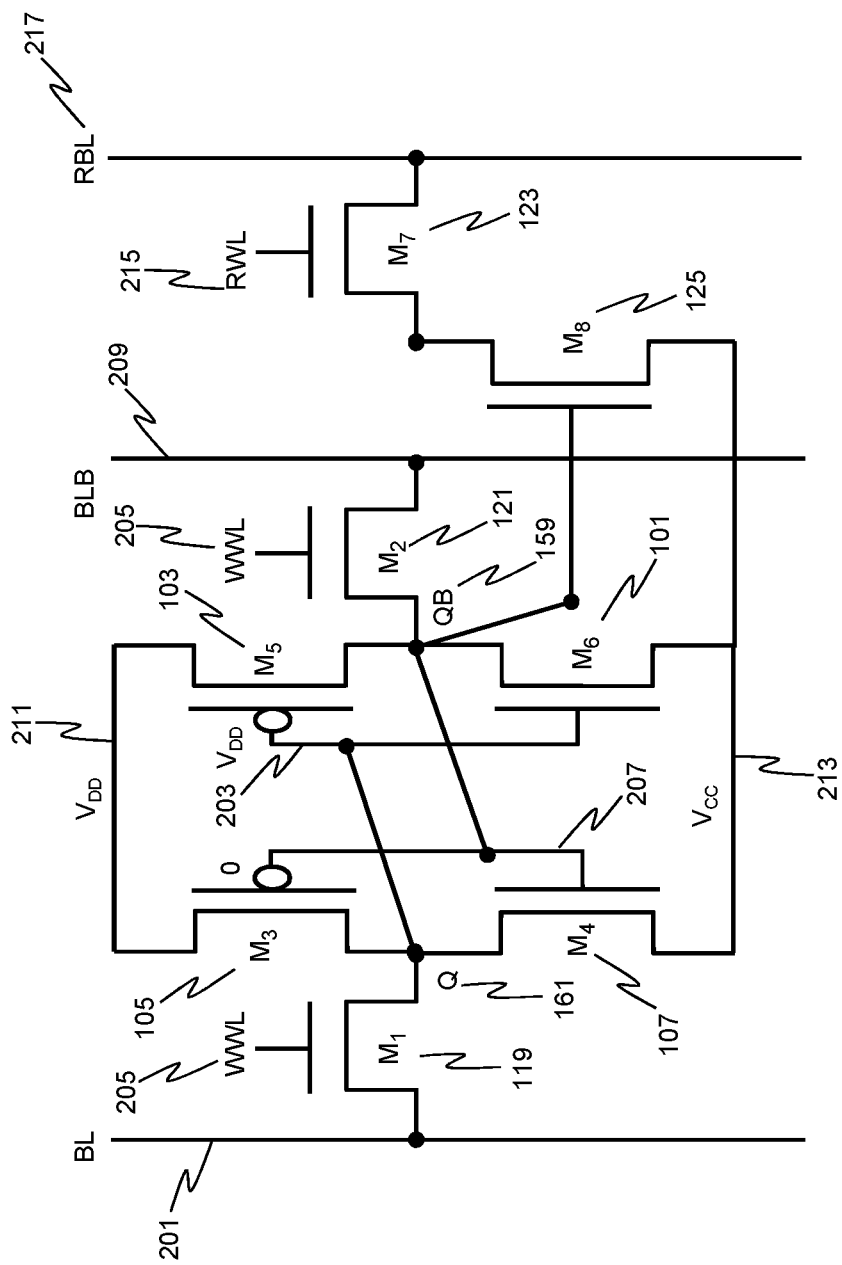
FIG. 2 schematically illustrates a circuit diagram of FIG. 1.

FIG. 1 schematically illustrates an axonometric view of a two-port vertical SRAM with the read driver transistor connected to a PD and PU inverter via a shared GAA and FIG. 2 schematically illustrates a circuit diagram of FIG. 1, all in accordance with an exemplary embodiment. Referring to FIG. 1, a PD transistor 101 (M6 of FIG. 2), a PU transistor 103 (M5), a PU transistor 105 (M3), and a PD transistor 107 (M4) are formed over a substrate 109, which is formed of an n-type well (NW) 111 and a p-type substrate (p-sub) 113. The PD transistor 101 and the PU transistor 103 are laterally separated from the PU transistor 105 and the PD transistor 107 in the first direction, as depicted by the arrow 115, and the PD transistor 101 and the PU transistor 103 are offset from the PU transistor 105 and the PD transistor 107 in the second direction, which is perpendicular to the first direction 115, as depicted by the arrow 117. A PG transistor 119 (M1) and a PG transistor 121 (M2) are also formed over the substrate 109 laterally separated in the first direction 115 and offset from each other in the second direction 117. Specifically, the PG transistor 119 is adjacent to the PD transistor 107 in the first direction 115 and the PG transistor 121 is adjacent to the PD transistor 101 in the first direction 115. Further, a read transistor 123 (M7) and a read driver transistor 125 (M8) are formed laterally separated in the first direction 115 over the substrate 109, the read transistor 123 and the read driver transistor 125 being adjacent to the PG transistor 121 and PD transistor 101 in the second direction 117, respectively.

PD transistors 101 and 107, the PU transistors 103 and 105, the PG transistors 119 and 121, and the read and read driver transistors 123 and 125, respectively, are conventionally formed by forming nRX 127, 129, and 131 laterally separated in the second direction 117 over the substrate 109 and pRX 133 and pRX 135 (not shown for illustrative convenience) over the substrate 109 laterally separated in the second direction 117 and offset in the first direction 115. The pRX 133 and pRX 135 are electrically connected to the nRX 129 and the nRX 131 by metal layers 137 and 139 (not shown for illustrative convenience), respectively. Two pairs of vertical nanowires 141 are formed, e.g., by etching, laterally separated over each nRX 127, 129, and 131 and a pair of vertical nanowires or a vertical fin 143 is formed, e.g., by etching, over each pRX 133 and 135. GAA 145, 147, and 149 are each formed over the nRX 127, nRX 129, and nRX 133, respectively, forming the read transistor 123, the PG transistor 121, and the PG transistor 119, respectively. Similarly, a shared GAA 151 is formed over the nRX 127 and 129 and the pRX 131, forming and connecting the read driver transistor 125, the PD transistor 101, and the PU transistor 103, respectively. Further, a shared GAA 153 is formed over the nRX 133 and pRX 135, forming the PU transistor 105 and the PD transistor 107, respectively. Top and bottom spacers (not shown for illustrative convenience) are also formed below and above the GAA 145, 147, and 149 and the shared GAA 151 and 153. Specifically, the shared GAA 151 forms a PD/PU inverter 155 and the shared GAA 153 forms a PD/PU inverter 157 such that the read driver transistor 125 is connected to the PD/PU inverter 155.

The inverters 155 and 157 are then cross-coupled by forming a vertical cross-couple contact 159 between the shared GAA 153 and the pRX 131 and a vertical cross-couple contact 161 between the shared GAA 151 and the pRX 135. In this instance, the vertical cross-couple contacts 159 and 161 are each formed of a metal layer 163, the metal layer 163 is recessed, and a dielectric layer 165 is formed over the metal layer 163. CB 167, 169, and 171 are then formed over a portion of the GAA 145, 147, and 149, respectively. Next, CA 173, 175, 177, 179, 181, and 183 are each formed over the pair of vertical nanowires 141 or the vertical fin 143 of each of the read transistor 123, the PG transistor 121, the PU transistor 105, the PU transistor 103, the PD transistor 107, and the PG transistor 119, respectively, and a shared CA 185 is formed over the pairs of vertical nanowires 141 or the vertical fins 143 of the read driver transistor 125 and the PD transistor 101. In this instance, the CB 167, 169, and 171 are connected to a RWL, a WWL, and the WWL, respectively; the CA 173, 175, 177, 179, 181, and 183 are connected to a RBL, a BLB, a Vdd, the Vdd, a Vcc, and a BL, respectively, and the shared CA 185 is connected to the Vcc (all not shown for illustrative convenience). Consequently, the shared CA 185 of the read driver transistor 125 and the PD transistor 101 is connected to the Vcc.

Referring to FIG. 2 (corresponding references to FIG. 1 in parenthesis), the gates M1, M2, M3, M4, M5, M6, M7, and M8 correspond to the PG transistor 119, the PG transistor 121, the PU transistor 105, the PD transistor 107, the PU transistor 103, the PD transistor 101, the read transistor 123, and the read driver transistor 125 of FIG. 1, respectively. Specifically, the source of M1 (nRX 133 of the PG transistor 119) is connected to the BL 201 (through the CA 183); the drain (nRX 133) is connected to the drain of M3 (pRX 135 of the PU transistor 105 via the metal layer 139), the source of M4 (nRX 133 of the PD transistor 107), and the latch node Q (vertical cross-couple contact 161), which is connected to the shared gate 203 (shared GAA 151); and the gate (149) is connected to the WWL 205 (through the CB 171). The source of M2 (nRX 129 of the PG 121 transistor) is connected to the source of M5 (pRX 133 of the PU transistor 103 via the metal layer 137), the drain of M6 (nRX 129 of the PD transistor 101), and the latch node QB (vertical cross-couple contact 159), which is connected to shared gate 207 (shared GAA 153); the drain is connected to the BLB 209 (through the CA 175); and the gate is connected to the WWL 205 (through the CB 169). The source of M3 (pRX 135 of the PU transistor 105) is connected to Vdd 211, which is also connected to the drain of M5 (pRX 133 of the PU transistor 103 via the vertical cross-couple contact 161); the gate is connected to the shared gate 207

(shared GAA 153); and the drain is connected to the latch node Q and the source of M4 (nRX 133 of the PD transistor 107 via the metal layer 139).

As previously mentioned, the source of M4 (nRX 133 of the PD transistor 107) is connected to the latch node Q and the drain of M3; the gate is connected to the shared gate 207 (shared GAA 153); and the drain is connected to Vcc 213, which is also connected to the source of M6 (nRX of the PD 101 via the metal layer 139, the vertical cross-couple contact 161, and the metal layer 137). As also mentioned, the source of M5 (pRX 133 of the PU transistor 103) is connected to the drain of M6 (pRX 129 of the PD transistor 101 via the metal layer 137) and the latch node QB; the gate is connected to the shared gate 203 (shared GAA 151); and the drain is connected to Vdd 211, which is connected to the source of M3 (pRX 135 of the PU transistor 105 via the vertical cross-couple contact 159). Further, as mentioned, the source of M6 (nRX 129 of the PD transistor 101) is connected to Vcc 213, which is connected to the drain of M4 (nRX 133 of the PD transistor 107 via the metal layer 137, the vertical cross-couple contact 159, and the metal layer 139); the gate is connected to the shared gate 203 (shared GAA 151); and the drain is connected to the source of M5 (nRX 133 of the PU transistor 103 via the metal layer 137) and the latch node QB.

With respect to M7 and M8, which together form a read buffer, the source of M7 (nRX 127 of the read transistor 123) is connected to the drain of M8 (nRX 127 of the read driver transistor 125); the gate is connected to the RWL 215 (via the CB 167); and the drain is connected to the RBL 217 (via the CA 173). Last, the source of M8 (nRX 127 of the read driver transistor 125) is connected to the source of M6 (via the shared GAA 151) and Vcc 213; the gate is connected to the latch node QB (vertical cross-couple contact 161), the drain of M6 (nRX 129), and the source of M5 (nRX 131) (all via the shared GAA 151); and the drain is connected to the source of M7 (shared nRX 127). Although the gate is depicted separately from the shared gate 203 (shared GAA 151) in FIG. 2, it is contemplated that M8, M6, and M5 all share the same shared gate 203 (shared GAA 151).

Figure 3:
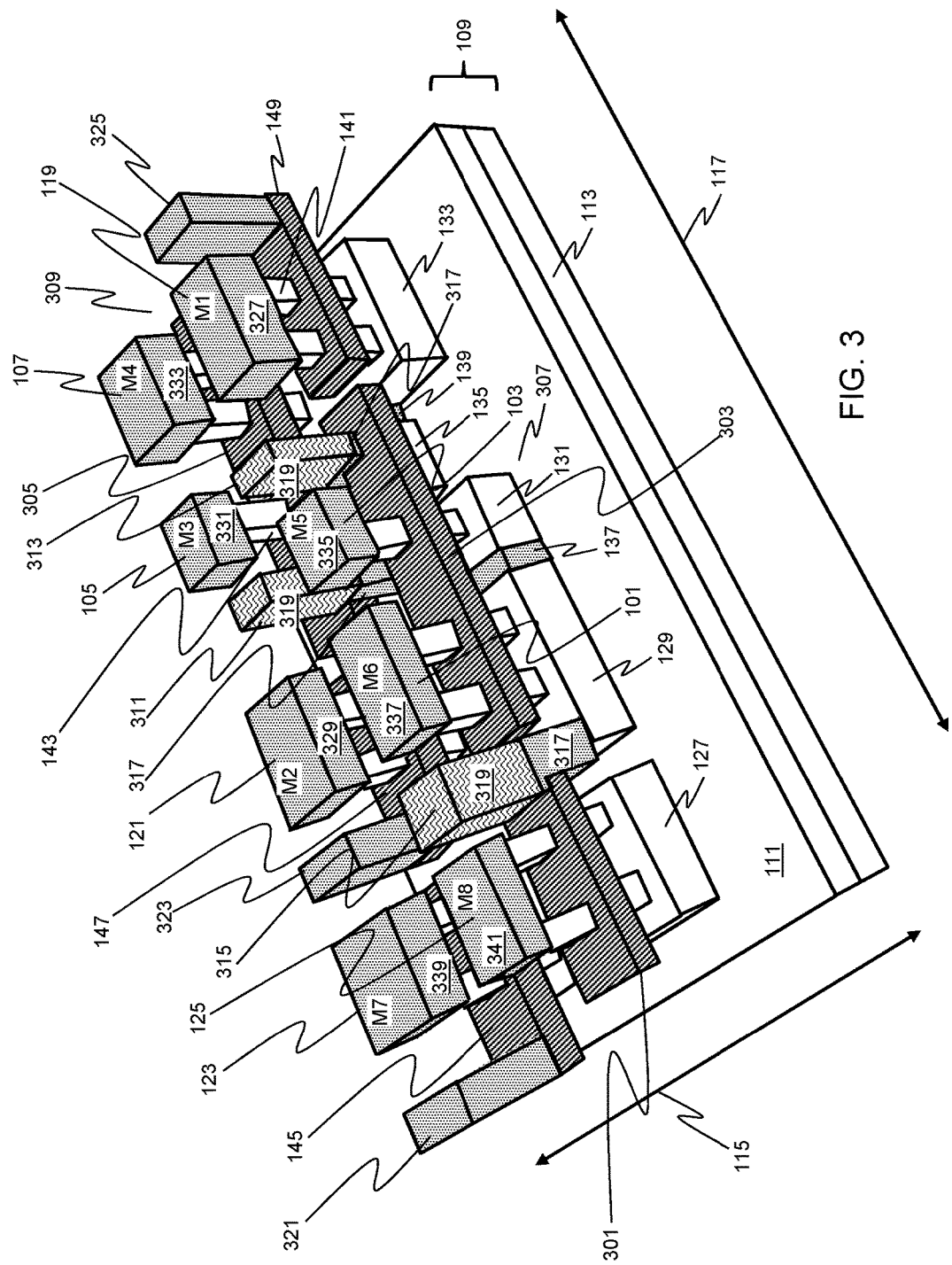
FIG. 3 schematically illustrates an axonometric view of a two-port vertical SRAM with the read driver transistor connected to a PD and PU inverter via a vertical cross-couple contact between the GAA of the read driver transistor and the bottom source/drain region of the PD and PU inverter, in accordance with an exemplary embodiment.
Figure 4:
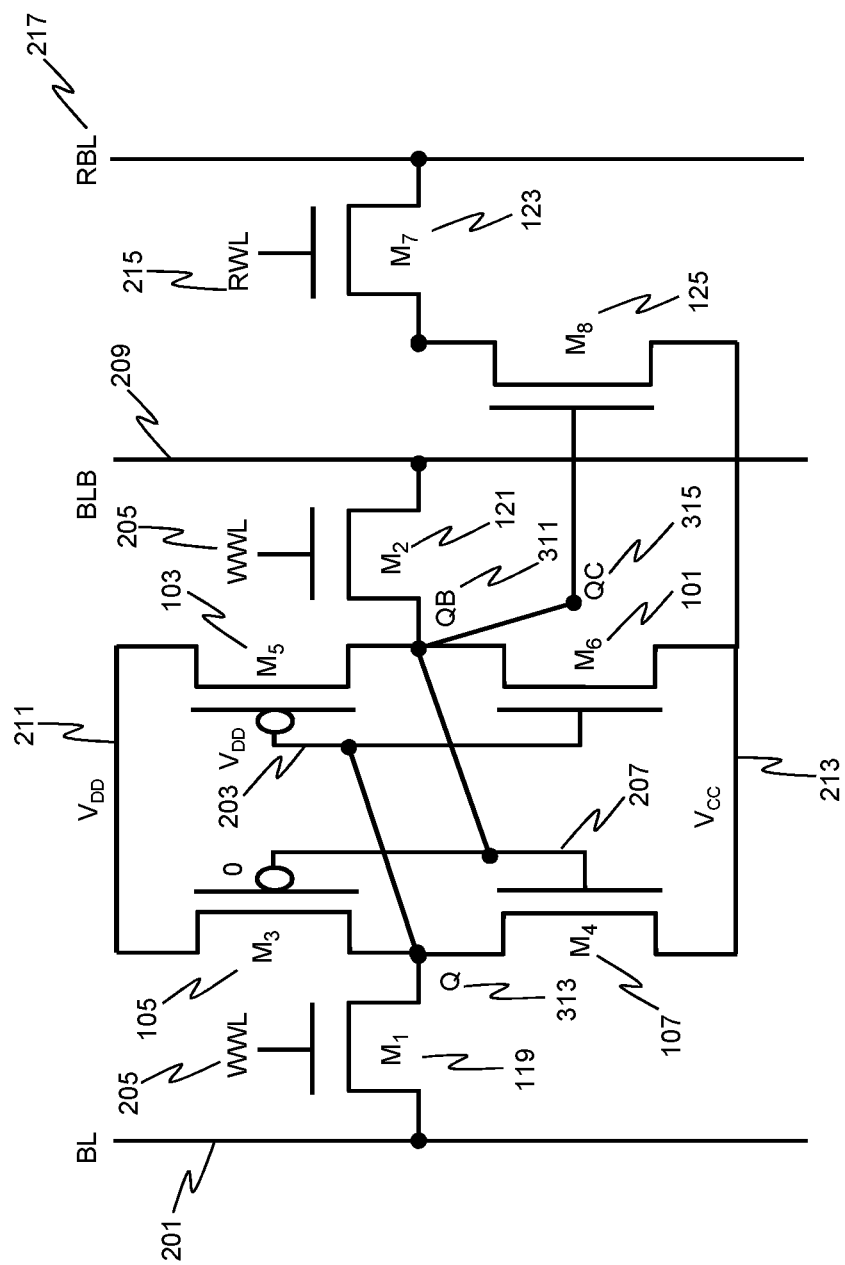
FIG. 4 schematically illustrates a circuit diagram of FIG. 3.

FIG. 3 schematically illustrates an axonometric view of a two-port vertical SRAM with the read driver transistor connected to a PD and PU inverter via a vertical cross-couple contact between the GAA of the read driver transistor and the bottom source/drain region of the PD and PU inverter and FIG. 4 schematically illustrates a circuit diagram of FIG. 3, all in accordance with an exemplary embodiment. Referring to FIG. 3, the device of FIG. 3 is nearly identical to the device of FIG. 1, e.g., the elements 101 to 149 are identical and the overall layout is the same, except in this instance, the read driver transistor is connected to a PD transistor via a vertical cross-couple contact rather than a shared GAA. Therefore, rather than having a shared GAA 151 over the nRX 127 and 129 and the pRX 131, the two-port vertical SRAM of FIG. 3 includes a GAA 301 formed over the read driver transistor 125 and a shared GAA 303 formed over the PD transistor 101 and the PU transistor 103. A shared GAA 305 (shared GAA 153 of FIG. 1) is formed over the nRX 133 and pRX 135, forming the PU transistor 105 and the PD transistor 107, respectively. Top and bottom spacers (not shown for illustrative convenience) are also formed below and above the GAA 145, 147, 149, and 301 and the shared GAA 303 and 305. Specifically, the shared GAA 303 forms a PD/PU inverter 307 and the shared GAA 305 forms a PD/PU inverter 309.

Similar to the device of FIG. 1, the inverters 307 and 309 are cross-coupled by forming a vertical cross-couple contact 311 between the shared GAA 305 and the pRX 131 and a vertical cross-couple contact 313 between the shared GAA 303 and the pRX 135. Likewise, a vertical cross-couple contact 315 is formed between the GAA 301 of the read driver transistor 125 and the nRX 129 of the PD transistor 101. In this instance, each vertical cross-couple contact 311, 313, and 315 is formed of a metal layer 317, the metal layer 317 is recessed, and a dielectric layer 319 is formed over the metal 317. CB 321, 323, and 325 are then formed over a portion of the GAA 145, 147, and 149, respectively. Next, CA 327, 329, 331, 333, 335, 337, 339, and 341 are each formed over the pair of vertical nanowires 141 or the vertical fin 143 for each of the PG transistor 119, the PG transistor 121, the PU transistor 105, the PD transistor 107, the PU transistor 103, the PD transistor 101, the read transistor 123, and the read driver transistor 125. In this instance, the CB 321, 323, and 325 are connected to a RWL, a WWL, and a WL, respectively, and the CA 327, 329, 331, 333, 335, 337, 339, and 341 are connected to a BL, a BLB, a Vdd, a Vcc, the Vdd, the Vcc, a RBL, and the Vcc, respectively (all not shown for illustrative convenience). Consequently, the CA 341 of the read driver transistor 125 and the CA 337 of PD transistor 101 are connected to the Vcc.

Referring to FIG. 4, FIG. 4 is identical to FIG. 2, except that in this instance, the latch node Q is the vertical cross-couple contact 313 of FIG. 3, the latch node QB is the vertical cross-couple contact 311, and the latch node QC is the vertical cross-couple contact 315, which connects the gate of M8 (GAA 301) to the drain of M6 (nRX 129) and the source of M5 (pRX 131 via the metal layer 137).

The embodiments of the present disclosure can achieve several technical effects including providing a balance between the conflicting requirements on PG Ion for cell stability and cell writability to achieve a better Ysoft while maintaining a small footprint relative to known SRAM. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with a VFET SRAM in the 5 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a first pull-down (PD) transistor, a first pull-up (PU) transistor, a second PU transistor, and a second PD transistor over a substrate, the first PD transistor and the first PU transistor laterally separated from the second PU transistor and the second PD transistor in a first direction and offset from the second PU transistor and the second PD transistor in a second direction perpendicular to the first direction, wherein forming the first PG transistor, the second PU transistor, and the second PD transistor, by:

forming a first n-type active region (nRX) and a first p-type active region (pRX) over the substrate laterally separated in the second direction;

forming a metal layer between the first nRX and the first pRX, the metal layer electrically connecting the first nRX and the first pRX, forming a pair of vertical nanowires or a vertical fin over the first nRX or the first pRX for each of the first PG transistor, the second PU transistor, and the second PD transistor;

forming a gate-all-around (GAA) over the first nRX and around the pair of vertical nanowires or the vertical fin of the first PG transistor; and forming a shared GAA over the first nRX and the first pRX and around the pair of vertical nanowires or the vertical fin for each of the second PD transistor and the second PU transistor, wherein the first PG transistor and the second PD transistor share the first nRX and the second PU transistor comprises the first pRX;

forming a first pass gate (PG) transistor and a second PG transistor over the substrate laterally separated in the first direction and offset from each other in the second direction, the first PG transistor adjacent to the second PD transistor in the first direction and the second PG transistor adjacent to the first PD transistor in the first direction;

forming a read transistor and a read driver transistor laterally separated in the first direction over the substrate, the read transistor and the read driver transistor adjacent to the second PG transistor and the first PD transistor in the second direction, respectively; and connecting the read driver transistor, the first PD transistor, and the first PU transistor.

2. The method according to claim 1, forming the read transistor and the second PG transistor by:

forming a second nRX and a third nRX over the substrate laterally separated in the second direction, the second nRX being on an opposite side of the third nRX from the first pRX;

forming a pair of vertical nanowires or a vertical fin for each of the read transistor and the second PG transistor;

forming a GAA over the second nRX and around the pair of vertical nanowires or the vertical fin for the read transistor; and forming a GAA over the third nRX and around the pair of vertical nanowires or the vertical fin for the second PG transistor.

3. The method according to claim 2, forming the read driver transistor, the first PD transistor, and the first PU transistor by:

forming a second pRX over the substrate laterally separated from the third nRX and the first pRX in the second direction, between the third nRX and the first pRX, and offset from the first pRX in the first direction;

forming a metal layer between the third nRX and the second pRX, the metal layer electrically connecting the third nRX and the second pRX;

forming a pair of vertical nanowires or a vertical fin of each of the read driver transistor, the first PD transistor, and the first PU transistor; and forming a shared GAA over the second nRX, the third nRX, and the second pRX and around the pair of vertical nanowires or the vertical fin of each of the read driver transistor, the first PD transistor, and the first PU transistor, or a GAA over the second nRX and around the pair of vertical nanowires or the vertical fin for the read driver transistor and a shared GAA over the third nRX and the second pRX and around the pair of vertical nanowires or the vertical fin of each of the first PD transistor and the first PU transistor, respectively, wherein the first PD transistor and the second PG transistor share the third nRX and the first PU transistor comprises the second pRX.

4. The method according to claim 3, wherein the GAA for read driver transistor is formed, the method further comprising connecting the read driver transistor, the first PD transistor, and the first PU transistor by:

forming a vertical cross-couple contact between the GAA and the third nRX.

5. The method according to claim 4, further comprising cross-coupling the first PD transistor and the first PU transistor with the second PU transistor and the second PD transistor by:

forming a first vertical cross-couple contact between the shared GAA of the second PU transistor and the second PD transistor and the second pRX; and forming a second vertical cross couple contact between either the shared GAA of the read transistor, the first PD transistor, and the first PU transistor or the shared GAA of the first PD transistor and the first PU transistor and the first pRX.

6. The method according to claim 5, further comprising:

forming a first gate contact (CB), a second CB, and a third CB over a portion of each GAA of the read transistor, the second PG transistor, and the first PG transistor;

forming a first source/drain contact (CA), a second CA, a third CA, a fourth CA, a fifth CA, and a sixth CA over the pair of vertical nanowires or the vertical fin of each of the read transistor, the first PU transistor, the second PD transistor, the second PU transistor, the first PG transistor, and the second PG transistor, respectively; and forming a shared CA over the pair of vertical nanowires or the vertical fin of each of the read driver transistor and the first PD transistor when the shared GAA of the read driver transistor, the first PD transistor, and the first PU transistor is formed or a seventh CA and an eighth CA over the pair of vertical nanowires or the vertical fin of each of the read driver transistor and the first PD transistor, respectively.

7. The method according to claim 6, wherein the first CB, the second CB, and the third CB are connected to a read word line (RWL), a write word line (WWL), and a word line (WL), respectively, the first CA, the second CA, the third CA, the fourth CA, the fifth CA, and the sixth CA are connected to a read bitline (RBL), a bitline-bar (BLB), a voltage drain (Vdd), the Vdd, a voltage supply (Vcc), the Vcc, and a bitline (BL), respectively, and the shared CA or the seventh CA and the eighth CA are connected to the Vcc.

8. A device comprising:

a first pull-down (PD) transistor, a first pull-up (PU) transistor, a second PU transistor, and a second PD transistor over a substrate, the first PD transistor and the first PU transistor laterally separated from the second PU transistor and the second PD transistor in a first direction and offset from the second PU transistor and the second PD transistor in a second direction perpendicular to the first direction, wherein the first PG transistor, the second PU transistor, and the second PD transistor comprise:

a first n-type active region (nRX) and a first p-type active region (pRX) over the substrate laterally separated in the second direction;

a metal layer between the first nRX and the first pRX electrically connecting the first nRX and the first pRX;
a pair of vertical nanowires or a vertical fin over the first nRX or the first pRX for each of the first PG transistor, the second PU transistor, and the second PD transistor;
a gate-all-around (GAA) over the first nRX and around the pair of vertical nanowires or the vertical fin for the first PG transistor; and
a shared GAA over the first nRX and the first pRX and around the pair of vertical nanowires or the vertical fin of each of the second PD transistor and the second PU transistor,
wherein the first PG transistor and the second PD transistor share the first nRX and the second PU transistor comprises the first pRX;
a first pass gate (PG) transistor and a second PG transistor over the substrate laterally separated in the first direction and offset from each other in the second direction, the first PG transistor adjacent to the second PD transistor in the first direction and the second PG transistor adjacent to the first PD transistor in the first direction; and
a read transistor and a read driver transistor laterally separated in the first direction over the substrate, the read transistor and the read driver transistor adjacent to the second PG transistor and the first PD transistor, respectively, in the second direction,
wherein the first PD transistor and the first PU transistor are cross-coupled with the second PU transistor and the second PD transistor and the read driver transistor, the first PD transistor, and the first PU transistor are connected.

9. The device according to claim 8, wherein the read transistor and the second PG transistor comprise:
a second nRX and a third nRX over the substrate laterally separated in the second direction, the second nRX being on an opposite side of the third nRX from the first pRX;
a pair of vertical nanowires or a vertical fin for each of the read transistor and the second PG transistor;
a GAA over the second nRX and around the pair of vertical nanowires or the vertical fin of the read transistor; and
a GAA over the third nRX and around the pair of vertical nanowires or the vertical fin for the second PG transistor,
wherein the read transistor and the read driver transistor share the second nRX.

10. The device according to claim 9, wherein the read driver transistor, the first PD transistor, and the first PU transistor comprise:
a second pRX over the substrate laterally separated from the third nRX and the first pRX in the second direction, between the third nRX and the first pRX, and offset from the first pRX in the first direction;
a metal layer between the third nRX and the second pRX electrically connecting the third nRX and the second nRX;
a pair of vertical nanowires or a vertical fin for each of the read driver transistor, the first PD transistor, and the first PU transistor; and
a shared GAA over the second nRX, the third nRX, and the second pRX and around the pair of vertical nanowires or the vertical fin for each of the read driver transistor, the first PD transistor, and the first PU transistor, or a GAA over the second nRX and around the pair of vertical nanowires or the vertical fin of the read driver transistor and a shared GAA over the third nRX and the second pRX and around the pair of vertical nanowires or the vertical fin of each of the first PD transistor and the first PU transistor, respectively,
wherein the first PD transistor and the second PG transistor share the third nRX and the first PU transistor comprises the second pRX.

11. The device according to claim 10, wherein the GAA for read driver transistor is formed, the device further comprising:
a vertical cross-couple contact between the GAA and the third nRX.

12. The device according to claim 11, further comprising:
a first vertical cross-couple contact between the shared GAA of the second PU transistor and the second PD transistor and the second pRX; and
a second vertical cross-couple contact between either the shared GAA of the read transistor, the first PD transistor, and the first PU transistor or the shared GAA of the first PD transistor and the first PU transistor and the first pRX.

13. The device according to claim 12, further comprising:
a first source/drain contact (CA), a second CA, a third CA, a fourth CA, a fifth CA, a sixth CA over the pair of vertical nanowires or the vertical fin of each of the read transistor, the first PU transistor, the second PD transistor, the second PU transistor, the first PG transistor, and the second PG transistor, respectively;
a shared CA over the pair of vertical nanowires or the vertical fin of each of the read driver transistor and the first PD transistor when the shared GAA of the read driver transistor, the first PD transistor, and the first PU transistor is formed, or a seventh CA and an eighth CA over the pair of vertical nanowires or the vertical fin of each of the read driver transistor and the first PD transistor, respectively; and
a first gate contact (CB), a second CB, a third CB over a portion of each GAA of the read transistor, the second PG transistor, and the first PG transistor, respectively.

14. The device according to claim 13, wherein the first CB, the second CB, and the third CB are connected to a read word line (RWL), a write word line (WWL), and a word line (WL), respectively, the first CA, the second CA, the third CA, the fourth CA, the fifth CA, and the sixth CA are connected to a read bitline (RBL), a bitline-bar (BLB), a voltage drain (Vdd), the Vdd, a voltage supply (Vcc), the Vcc, and a bitline (BL), respectively, and the shared CA or the seventh CA and the eighth CA are connected to the Vcc.

15. A device comprising:
a first n-type active area (nRX), a second nRX, and a third nRX laterally separated in a first direction over a substrate;
a first p-type active area (pRX) and a second pRX over the substrate laterally separated in the first direction and offset in a second direction perpendicular to the first direction, the first pRX electrically connected to the second nRX and the second pRX electrically connected to the third nRX;
two pairs of vertical nanowires or a pair of vertical fins laterally separated in the second direction over each of the first nRX, the second nRX, and the third nRX;
a pair of vertical nanowires or a vertical fin over each of the first pRX and the second pRX;
a first gate-all-around (GAA) and a first shared GAA laterally separated in the second direction over the first nRX each around a pair of vertical nanowires or a vertical fin, the first shared GAA also over the second nRX and the first pRX and around a pair of vertical nanowires or a vertical fin and the pair of vertical nanowires or the vertical fin, respectively;

a second shared GAA over the third nRX and the second pRX and around a pair of vertical nanowires or a vertical fin and the pair of vertical nanowires or the vertical fin, respectively;

a second GAA and a third GAA over the second nRX and the third nRX, respectively, and each around a pair of vertical nanowires or a vertical fin;

a first vertical cross-couple contact between the second shared GAA and the first pRX and a second vertical cross-couple contact between the first shared GAA and the second pRX;

a first source/drain contact (CA) over a pair of vertical nanowires or a vertical fin of the first nRX, a second CA over two vertical nanowires or a vertical fin of the second nRX, a third CA and a fourth CA over the two vertical nanowires or the vertical fin of each of the first pRX and the second pRX, a fifth CA and a sixth CA each over two vertical nanowires or a vertical fin of the third nRX;

a shared CA over two vertical nanowires or a vertical fin of the first nRX and over two vertical nanowires or a vertical fin of the second nRX; and a first gate contact (CB), a second CB, and a third CB over the first GAA, the second GAA, and the third GAA, respectively.

16. The device according to claim 15, wherein first nRX forms a read transistor and a read driver transistor, the second nRX forms a first pass gate (PG) transistor and a first pull-down (PD) transistor, the first pRX forms a first pull-up (PU) transistor, the second pRX forms a second PU transistor, and the third nRX forms a second PD transistor and a second PG transistor.

17. The device according to claim 15, wherein the first CB, the second CB, and the third CB are connected to a read word line (RWL), a write word line (WWL), and a word line (WL), respectively, the first CA, the second CA, the third CA, the fourth CA, the fifth CA, and the sixth CA are connected to a read bitline (RBL), a bitline-bar (BLB), a voltage drain (Vdd), the Vdd, a voltage supply (Vcc), the Vcc, and a bitline (BL), respectively, and the shared CA or the seventh CA and the eighth CA are connected to the Vcc.

18. The device according to claim 17, wherein the first shared GAA connects the read driver transistor and the first PD transistor and the first PU transistor.

* * * * *